United States Patent [19]
Adachi et al.

[11] Patent Number: 6,077,321
[45] Date of Patent: Jun. 20, 2000

[54] WET/DRY SUBSTRATE PROCESSING APPARATUS

[75] Inventors: Hideki Adachi; Akira Izumi, both of Kyoto, Japan

[73] Assignee: Dainippon Screen Mfg. Co., Ltd., Japan

[21] Appl. No.: 08/966,295

[22] Filed: Nov. 7, 1997

[30] Foreign Application Priority Data

Nov. 8, 1996 [JP] Japan ................................ 8-296453

[51] Int. Cl.$^7$ .......................... H01L 21/00; H01L 21/64; C23C 14/00; C23C 9/00
[52] U.S. Cl. ...................... 29/25.01; 204/298.25
[58] Field of Search ................ 29/25.01; 204/298.25, 204/298.26, 298.35; 438/908

[56] References Cited

U.S. PATENT DOCUMENTS 4,917,556  4/1990  Stark et al. .
4,951,601  8/1990  Maydan et al. .

*Primary Examiner*—David E. Graybill
*Attorney, Agent, or Firm*—Ostrolenk, Faber, Gerb & Soffen, LLP

[57] ABSTRACT

A buffer chamber is provided between a transfer chamber and a cleaning/drying chamber, and completely-closable shutters are provided between the transfer chamber and the buffer chamber as well as between the buffer chamber and the cleaning/drying chamber. The cleaning/drying chamber serving as a composite processing part including a processing in the wet atmosphere is connected with the remaining chambers of dry atmospheres.

12 Claims, 8 Drawing Sheets

A/P = ATMOSPHERIC PRESSURE

WET/DRY SUBSTRATE PROCESSING APPARATUS

BACKGROUND OF THE INVENTION

1. Field of the Invention

The present invention relates to a substrate processing system comprising a plurality of processing parts around a transfer part for transferring substrates such as semiconductor wafers or liquid crystal glass substrates, for transferring the substrates to the processing parts through the transfer part and performing prescribed processings on the substrates.

2. Description of the Background Art

A substrate cleaning device of an individual substrate type, which is generally employed for cleaning substrates before film formation, is independent of a film forming device in general. While an improvement may be made by connecting and integrating these devices with each other, problems arising in the case of simply connecting the devices with each other are considered with reference to a virtual system shown in FIG. 8.

In this system, each of substrates W which are taken out one by one from a loader 901 is transferred by a transfer mechanism (not shown), to be cleaned in a cleaning part 902, thereafter dried in a drying part 903, then received and transferred by a transfer robot (not shown) provided on a transfer part 904, subjected to film formation in any of film forming parts 905, and thereafter transferred by the transfer part 904 again and discharged to an unloader 906. In this system, an atmosphere in the cleaning part 902 is not completely dried (hereinafter referred to as a "wet atmosphere"), while atmospheres in the drying part 903, the transfer part 904, the film forming parts 905 and the unloader 906 are completely dried (hereinafter referred to as "dry atmospheres"). With reference to a boundary area of dew points of −80° C. to −5° C., atmospheres having dew points of at least −5° C. and not more than −80° C. are referred to as wet and dry atmospheres respectively.

Processings which require the dry atmospheres cannot be performed in the wet atmosphere, and hence the device of FIG. 8 transfers the cleaned substrate W in a transfer area having an internal atmosphere gradually making transition from a wet atmosphere to a dry atmosphere, for drying the substrate W and then transferring the same to the transfer part 904.

However, the system of FIG. 8 has such disadvantages that the transfer area having the internal atmosphere gradually making transition from the wet atmosphere to the dry atmosphere is so long that the size of the system is increased, and that it is difficult to control the atmosphere in the transfer area for gradually making transition from the wet atmosphere to the dry atmosphere.

SUMMARY OF THE INVENTION

According to the present invention, a substrate processing system comprises a) a transfer part for transferring a substrate, b) a first processing part which is provided around the transfer part for processing the substrate in a dry atmosphere, c) a second processing part which is provided around the transfer part for processing the substrate in a wet atmosphere, and d) a buffer part which is provided between the transfer part and the second processing part.

Thus, it is possible to provide a compact substrate processing system comprising a plurality of processing parts having different atmospheres which do not influence with each other.

According to an aspect of the present invention, the substrate processing system further comprises g) control means for controlling an internal atmosphere of at least one of the second processing part and the buffer part.

Preferably, the atmospheric pressure in the transfer part is also controlled. Respective pressures may satisfy the condition p(T)>p(B)>p(P), where p(T) is an atmospheric pressure in the transfer part.

p(B) is an atmospheric pressure in the buffer part, and p(P) is an atmospheric pressure in the second processing part.

In the preferred embodiment of the present invention described later, the symbols p(T), p(B) and p(P) correspond to the symbols p1, p2 and p3, respectively.

Alternatively, another condition p(B)>p(T)>p(P) may be held. In both cases, the atmospheric pressure p(B) in the buffer part exceeds the atmospheric pressure p(P) in the second processing part.

An object of the present invention is to provide a compact substrate processing system connecting respective processing parts with each other while separating dry and wet atmospheres from each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<1. First Embodiment>

<1-1. Schematic Mechanical Structure and Device Arrangement>

Figure 1:
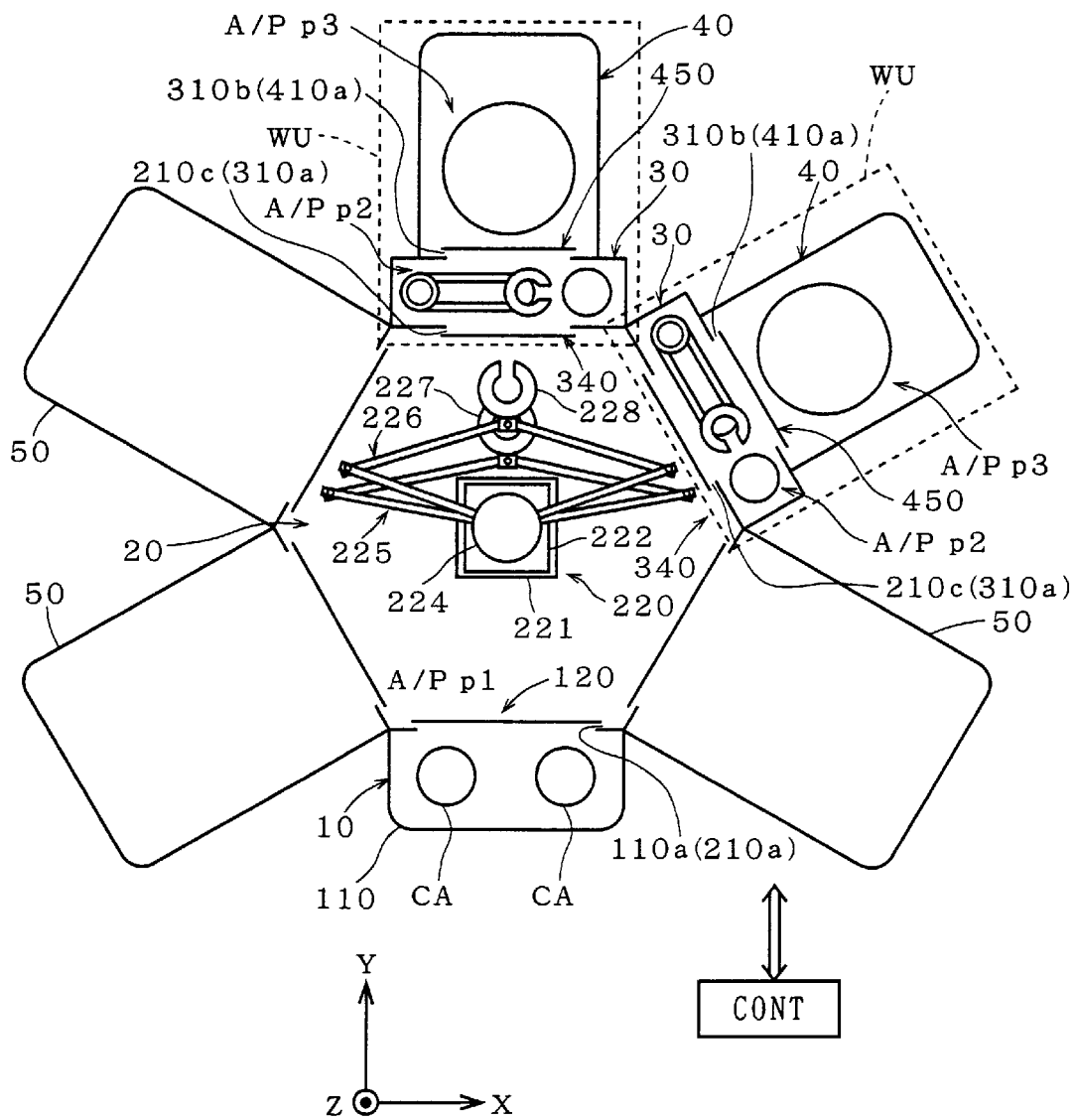
FIG. 1 is an overall block diagram showing a substrate processing system according to a first embodiment of the present invention.

FIG. 1 is a block diagram showing a substrate processing system 1 according to a first embodiment of the present invention. Referring to FIG. 1 and the following figures, three-dimensional coordinate systems X-Y-Z are defined with horizontal X-Y planes and with vertical Z-axis directions. The substrate processing system 1 is now described with reference to FIG. 1.

As shown in FIG. 1, the substrate processing system 1 comprises radial arrangement of a loader/unloader 10, two substrate processing units WU each consisting of a buffer chamber 30 and a cleaning/drying chamber 40 adjacent thereto, and three film forming chambers 50 around a transfer chamber 20 which is in the form of a hexagonal prism. The substrate processing system 1 is adapted to perform processings of individual substrate type for substrates W, e.g., semiconductor wafers. The system 1 further comprises a control unit CONT for controlling respective units and chambers. Although the control unit CONT is separately depicted in FIG. 1 for convenience of illustration, the control unit CONT may be provided in the body of the processing system 1. Cassettes CA each containing a plurality of unprocessed substrates W are introduced into a loader/unloader 10 from the exterior of the system 1. Under the electrical control by the control unit CONT, a mechanical hand 220 provided in the transfer chamber 20 takes each substrate W out of the cassette CA one by one, and transfers the substrate W to a selected one of the substrate processing units WU through the transfer chamber 20. The substrate transferred to the substrate processing units WU is introduced into the cleaning/drying chamber 40 through the buffer chamber 30. The substrate W is subjected to a wet-cleaning process and a drying process in the cleaning/drying unit WU. Then, the substrate W is transferred to the film forming chamber 50 through the buffer chamber 30 and the transfer chamber 20. The film forming chamber 50 is operable to form a film (an oxide film, for example) on the substrate W. The substrate W is then transferred to the loader/unloader 10 through the transfer chamber 20 and is contained again in the cassette CA. The substrate processing units WU are integrally manufactured to be readily mounted on side surfaces of the transfer chamber 20.

The schematic mechanical structures of the respective parts are now described.

The loader/unloader 10 is formed to be capable of holding the two cassettes CA therein. An opening 110*a* for introducing and discharging the cassettes CA is provided on a positive side surface of a Y-axis of a casing 110, and this opening 110*a* is provided with an incompletely-closable shutter 120 for incompletely cutting off atmospheres in the loader/unloader 10 and the transfer chambers 20. Another opening (not shown) is also provided on a negative side of the Y-axis, so that an operator sets the cassettes CA storing the unprocessed substrate W and takes out treated cassettes CA through this opening.

Figure 2:
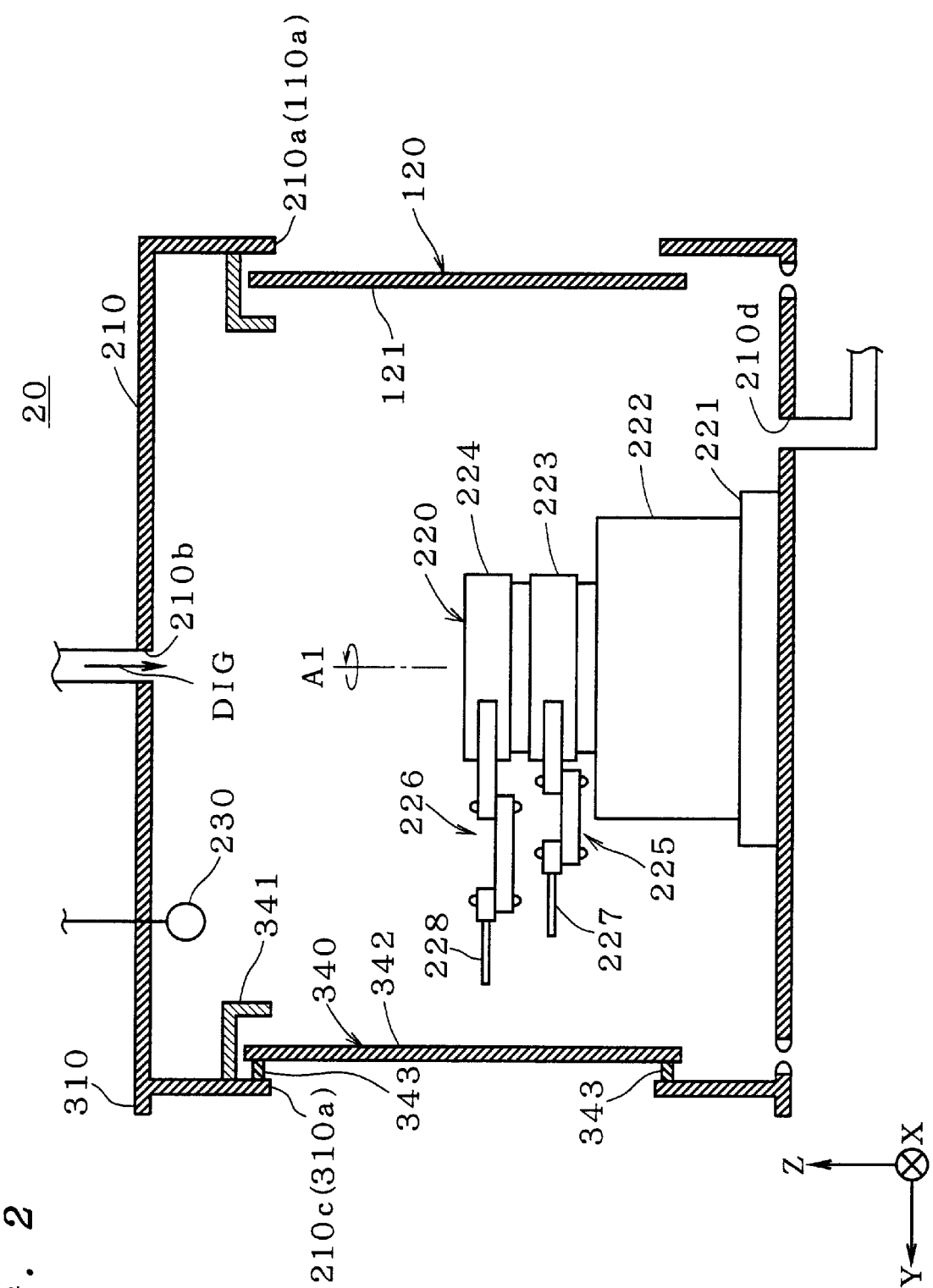
FIG. 2 is a sectional view of a transfer chamber according to the first embodiment of the present invention.

FIG. 2 is a sectional view of each transfer chamber 20. Six transfer openings (FIG. 2 shows only openings 210*a* (110*a*) and 210*c* (310*a*)) for the substrates W communicating with the loader/unloader 10 and the respective chambers are provided on six side surfaces of a casing 210 of the transfer chamber 20, and an incompletely-closable shutter 120 and a completely-closable shutter 340 are provided on peripheral inner wall surfaces thereof. Further, an inlet port 210*b* for supplying dry inert gas DIG and an outlet port 210*d* for discharging the internal atmosphere are provided on upper and bottom surfaces respectively.

Further, the casing 210 is provided on its central internal bottom surface with the mechanical hand 220, which comprises elevational/rotational parts 223 and 224, provided on an upper surface of a body 222 of a base 221, having pantographic articulated arms 225 and 226 and hands 227 and 228 provided on forward ends thereof respectively. The elevational/rotational parts 223 and 224 are vertically moved and rotated while the articulated arms 225 and 226 are contracted and expanded for passing and transferring each substrate W between the loader/unloader 10 and the respective chambers.

Further, a pressure sensor 230 is provided on an inner upper surface of the casing 210, so that the control unit CONT obtains the internal atmospheric pressure on the basis of an output from this pressure sensor 230 and performs atmospheric pressure control described later on the basis thereof.

Figure 3:
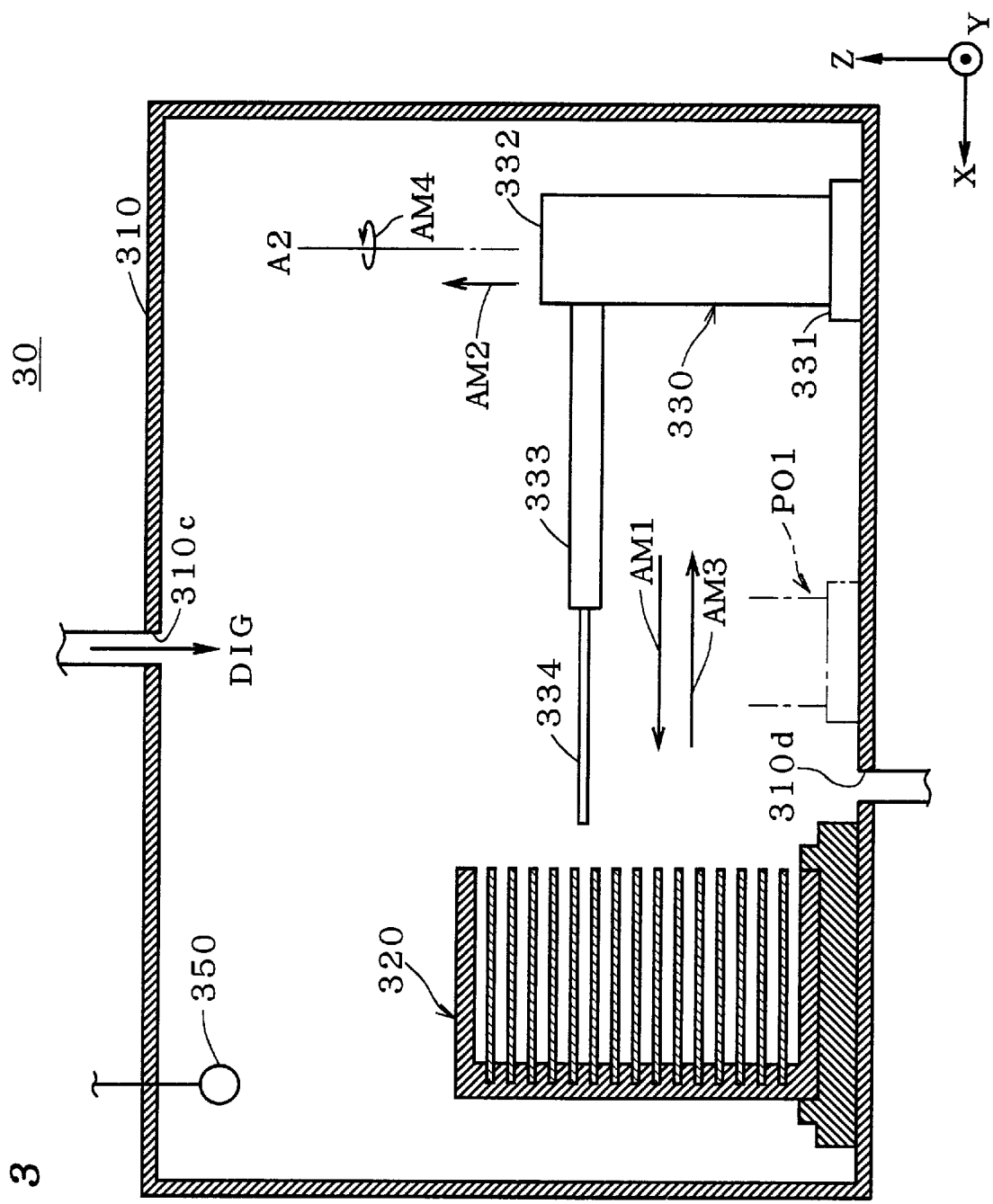
FIG. 3 is a vertical sectional view of a buffer chamber according to the first embodiment of the present invention.

FIG. 3 is a vertical sectional view of each buffer chamber 30. The buffer chamber 30 is provided with openings 310*a* and 310*b* (see FIG. 1) communicating with the transfer chamber 20 and the cleaning/drying chamber 40 respectively on negative and positive side surfaces along the Y-axis direction of a casing 310 respectively as openings for passing each substrate W. Further, an inlet port 310*c* for supplying dry inert gas DIG and an outlet port 310*d* for discharging the internal atmosphere are provided on upper and bottom surfaces of the casing 310 respectively.

In addition, a buffer cassette 320 and a transfer robot 330 are provided on an inner bottom surface of the casing 310. The transfer robot 330 takes out each substrate W previously introduced into the buffer cassette 320 by the mechanical hand 220 of the transfer chamber 20 and passes the same to the cleaning/drying chamber 40, or introduces each substrate W received from the cleaning/drying chamber 40 into the buffer cassette 320.

Further, a pressure sensor 350 is provided on an inner upper surface of the casing 310 similarly to the pressure sensor 230, so that the control unit CONT obtains the internal atmospheric pressure on the basis of an output from the pressure sensor 350 and performs atmospheric pressure control described later on the basis thereof.

Figure 4:
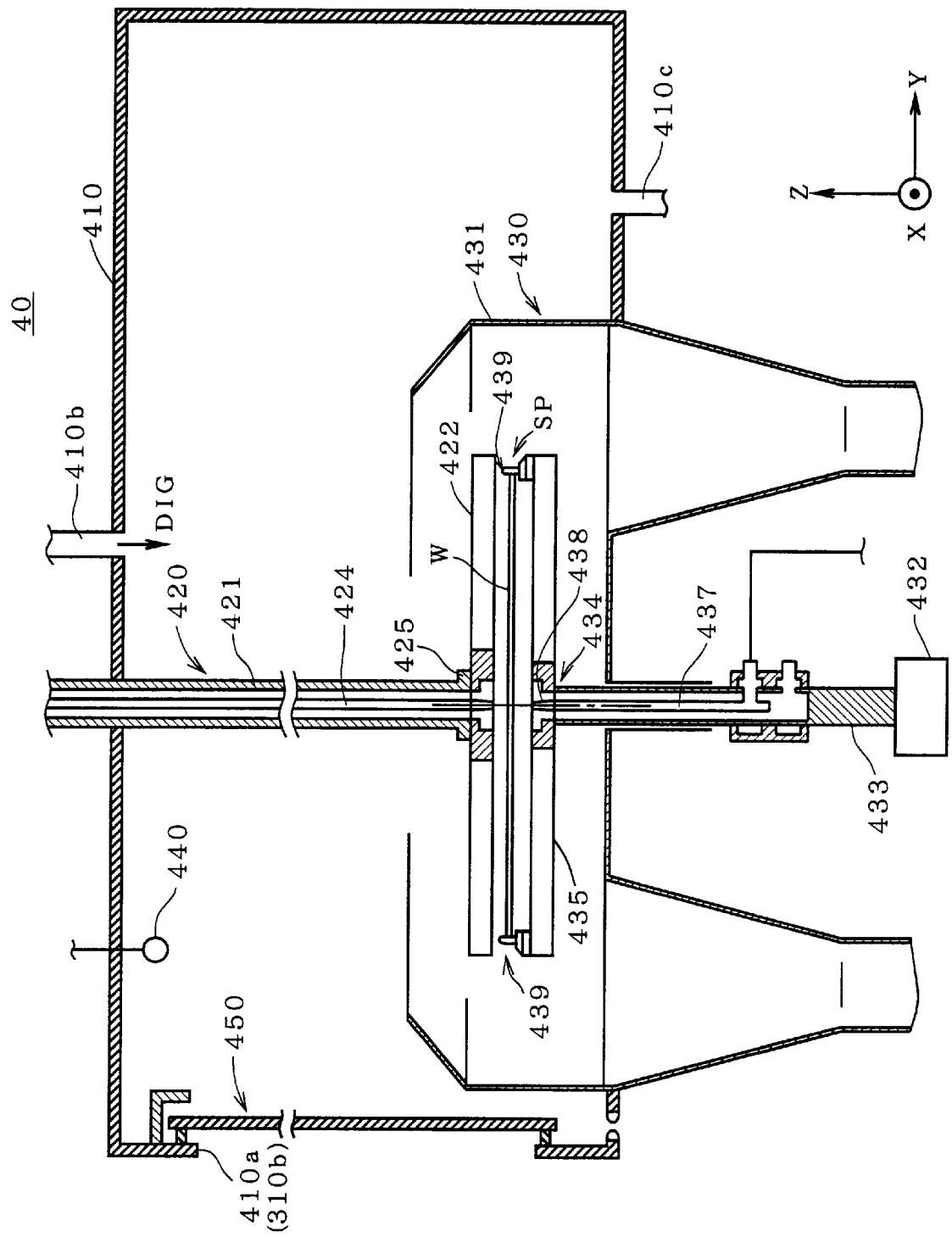
FIG. 4 is a sectional view of a cleaning/drying chamber according to the first embodiment of the present invention.

FIG. 4 is a sectional view of each cleaning/drying chamber 40. The cleaning/drying chamber 40 is provided with an opening 410*a* communicating with the buffer chamber 30 for serving as an opening for passing each substrate W on a negative side surface along the Y-axis direction of a casing 410 and a completely-closable shutter 450, which is similar to the completely-closable shutter 340, in its interior. Further, a downwardly directed cover part 420 is provided on an upper surface of the casing 410, while a spin processing part 430 is provided on an inner bottom surface thereof for wet-cleaning and drying each substrate W. in addition, a pressure sensor 440 which is similar to the pressure sensors 230 and 350 is provided on an inner upper surface of the casing 410, so that the control unit CONT obtains the internal atmospheric pressure on the basis of an output from the pressure sensor 440 and performs atmospheric pressure control described later on the basis thereof. This cleaning/drying chamber 40 serves as a composite processing part successively performing a plurality of types of substrate processings including the cleaning process in a wet atmosphere.

Each film forming chamber 50 forms a film on each substrate W received from the transfer chamber 20.

<1-2. Detailed Structures and Operations of Principal Parts>

Detailed structures and operations of the principal parts are now described.

First, the completely-closable shutter 340 is described with reference to FIG. 2. The completely-closable shutter 340 consists of a guide 341 which is provided on an outer wall portion around the opening 310*a* of the casing 310 of the buffer chamber 30, i.e., in the opening 210*c* of the casing 210 of the transfer chamber 20, and a flat plate member 342 vertically movably held by the same. The flat plate member 342 is vertically moved to open/close the opening 210*c* (310*a*). An elastic member 343 is fixed to the outer wall of the casing 310 (the inner wall of the casing 210) to enclose the opening 210*c* (310*a*), and the flat plate member 342 is positioned to be in close contact with the elastic member 343 in a state closing the opening 210c (310a). When the completely-closable shutter 340 is closed, therefore, atmospheric exchange between the transfer chamber 20 and the buffer chamber 30 is completely blocked. The completely-closable shutter 450 is similar in structure to the completely-closable shutter 340.

The incompletely-closable shutter 190 (FIG. 2) is also substantially similar in structure to the completely-closable shutters 340 and 450, except that no elastic member is provided between the inner wall of the casing 210 and a flat plate member 121. With reference to the incompletely-closable shutter 120, therefore, a little amount of atmospheric exchange takes place between the loader/unloader 10 and the transfer chamber 20 through a clearance between the casing 210 and the flat member 121. This is because the atmospheres in the loader/unloader 10 and the transfer chamber 20 are dry and no air tightness is particularly required.

Figure 5:
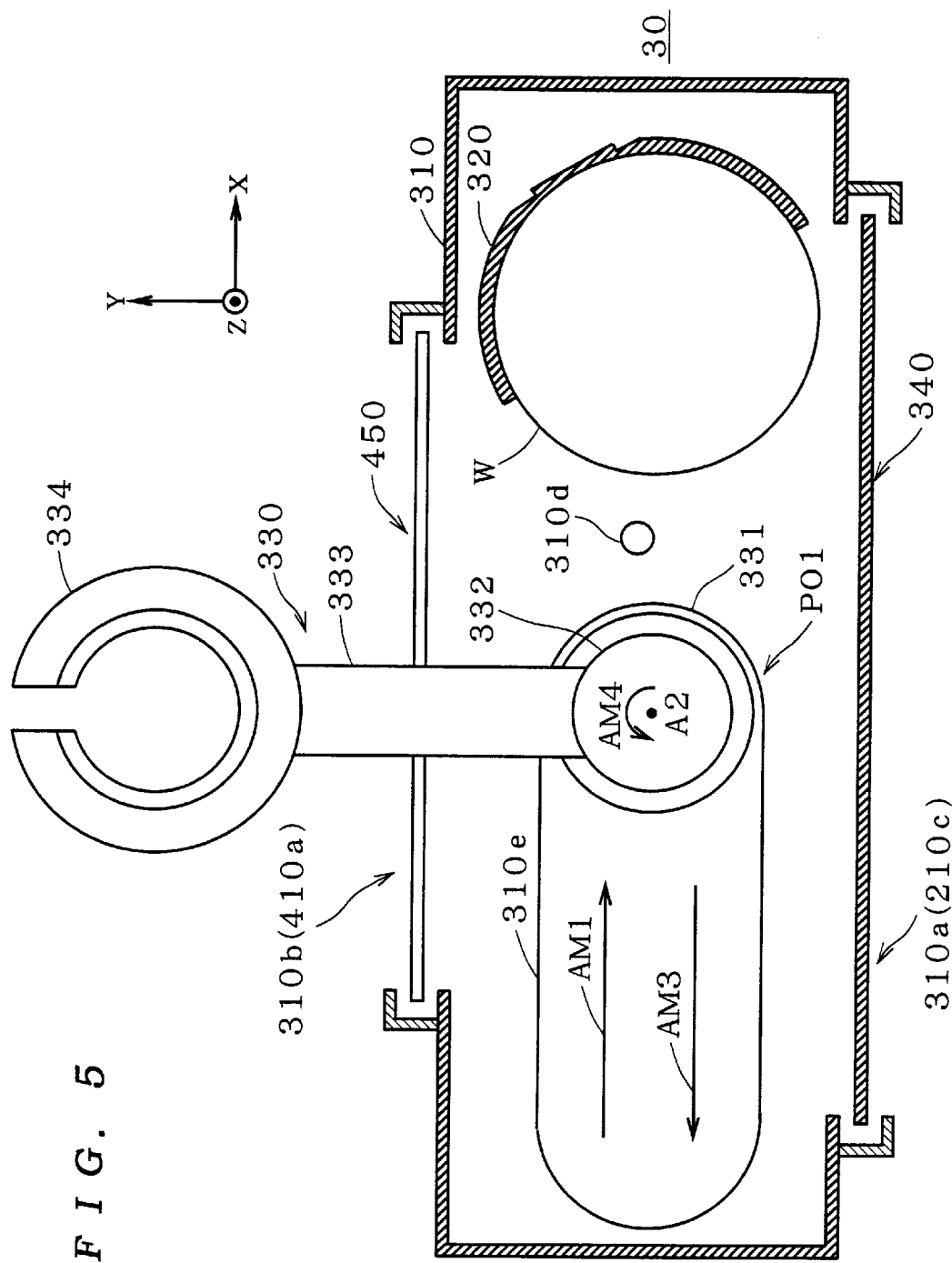
FIG. 5 is a horizontal sectional view of the buffer chamber according to the first embodiment of the present invention.

FIG. 5 is a horizontal sectional view of each buffer chamber 30. The transfer robot 330 of the buffer chamber 30 is now described with reference to FIGS. 3 and 5. As shown in FIG. 3, a body 332 of the transfer robot 330 in the buffer chamber 30 is provided on a base 331 which is fixed to the bottom surface, and the base 331 is horizontally movable along a moving groove 310e (FIG. 5) provided on the bottom surface of the casing 310 along positive and negative directions of an X-axis through driving by a horizontal driving part. The body 332 is vertically moved through driving by a vertical driving part provided in the base 331, and rotated about an axis A2 through driving by a rotation/driving part. An arm 333 having a hand 334 on its forward end is provided in the vicinity of an upper end of the body 332.

In such a structure, the body 332 is first moved along arrow AM1 (positive direction of the X-axis) to insert the hand 334 between the substrates W in the buffer cassette 320, thereafter moved up along arrow AM2 for supporting each substrate W on an upper surface of the hand 334, and temporarily moved along arrow AM3 (negative direction of the X-axis) as such. Then, the body 332 is rotated by 90° anticlockwise as viewed from above along arrow AM4, to he moved along arrow AM1 again and stopped on a stop position PO1 in a state (FIG. 5) directed to the negative direction of the Y-axis for passing each substrate W to the cleaning/drying chamber 40. The body 332 receives each substrate W from the cleaning/drying chamber 40 by operating in order opposite to the above.

The cover part 420 and the spin processing part 430 of the cleaning/drying chamber 40 are now described with reference to FIG. 4. In the cleaning/drying chamber 40, the cover part 420 has the following structure: A cover member 422 is horizontally provided on a lower end of a suspension arm 421 which is vertically arranged on an upper surface of the casing 410. The suspension arm 421 is vertically driven and rotated/driven along the vertical direction by vertical rotation/driving mechanism on an upper portion. Further, a cleaning liquid supply tube 424 which is connected to a cleaning liquid supply part is coaxially provided on a central portion of the suspension arm 421, and a nozzle 425 is provided on its lower end.

On the other hand, the spin processing part 430 has the following structure: A rotation/driving part 432 is provided under a cup 431 which is provided on the bottom surface of the casing 410, a rotary shaft 433 is connected thereto and vertically arranged to extend into the interior of the cup 431, and a spin chuck 434 and a base member 435 are horizontally provided on its upper end. The rotary shaft 433 is rotated about the vertical direction by the rotation driving part 432 provided under the same, thereby rotating the spin chuck 434 and the base member 435. Further, the rotary shaft 433 is coaxially provided with a cleaning liquid supply tube 437 on its central portion similarly to the suspension arm 421 of the cover part 420, and a nozzle 438 is provided on its upper end. In addition, a holding member 439 is provided on a peripheral edge portion of the base member 435.

The cover part 420 and the spin processing part 430 having the aforementioned structures operate as follows:

When each substrate W is introduced, the cover part 420 recedes to a portion above the rotary processing part 430, thereafter the hand 334 of the transfer robot 330 in the buffer chamber 30 supporting the substrate W advances to a position immediately above the cup 431, thereafter the rotary shaft 433 is moved up so that the spin chuck 434 and the base member 435 press the substrate W upward, and the holding member 439 holds the same. The spin processing part 430 is moved down and positioned as shown in FIG. 4.

In case of cleaning, the cover member 422 is approached to the surface of each substrate W held by the spin chuck 434 as shown in FIG. 4 so that the substrate W is held between the base member 435 and the cover member 422 and rotated along with the spin chuck 434 through driving by the rotation driving part 432, and a cleaning liquid is supplied to the centers of the front and rear surfaces of the substrate W from the nozzles 425 and 438 provided on the cover member 422 and the base member 435 for cleaning the substrate W.

In case of drying, rotation of each substrate W is continued and supply of the cleaning liquid from the nozzles 425 and 438 is stopped, whereby the substrate W is spin-dried.

As hereinabove described, each substrate W is held between the base member 435 and the cover member 422 in cleaning, whereby a wet atmosphere containing mist of the cleaning liquid is substantially blocked in a space SP between the members 435 and 522 and does not influence the dry atmosphere in the cleaning/drying chamber 40.

<1-3. Procedure and Atmospheric pressure Control>

In the substrate processing system 1 according to the first embodiment, atmospheric pressure control is so performed that the slightly wet atmosphere in the cleaning/drying chamber 40 does not influence the transfer chamber 20.

In order to inhibit atmospheres from flowing from the cleaning/drying chamber 40 into the buffer chamber 30 and from the buffer chamber 30 into the transfer chamber 20, the following atmospheric pressure relation is preferably satisfied immediately before the shutters between the chambers are opened:

$$p1>p2>p3 \ldots \text{atmospheric pressure relation} \tag{1}$$

where
p1 is the atmospheric pressure in the transfer chamber 20,
p2 is the atmospheric pressure in the buffer chamber 30, and
p3 is the atmospheric pressure in the cleaning/drying chamber 40.

Thus, the transfer chamber 20, the buffer chamber 30 and the cleaning/drying chamber 40 are controlled to have the highest atmospheric pressure p1, a medium air atmosphere p2, and the lowest atmospheric pressure p3 respectively.

Supply of the dry inert gas DIG and exhaust control of the internal atmospheres are now described. The respective chambers of the substrate processing system 1 comprise the inlet ports 210b, 310c and 410b for supplying prescribed amounts of the dry inert gas DIG and the outlet ports 210d, 310d and 410c for discharging the internal atmospheres. In order to meet the atmospheric pressure relation (1), the processing system 1 is constructed according to the following two conditions:

i) the respective amounts of the dry inert gas DIG supplied through the inlet ports 210b, 310c and 410b are decreased in the order of the inlet ports 210b, 310c and 410b, i.e., IN2>IN3>IN4 where IN2 is the gas supply to the transfer chamber 20, IN3 is the gas supply to the buffer chamber 30, and IN4 is the gas supply to the cleaning/drying chamber 40; and ii) the respective diameters or cross sections of the outlet ports 210d, 310d and 410c are increased in the order of the outlet ports 210d, 310d and 410c, i.e., OUT2<OUT3<OUT4 where

OUT2 is the outlet from the transfer chamber 20,

OUT3 is the outlet from the buffer chamber 30, and

OUT4 is the outlet from the cleaning/drying chamber 40.

Thus, the atmospheric pressure relation (1) in a long time after the shutters 340 and 450 are closed.

Even in this structure, however, the atmospheres of the chambers adjacent to each other are equalized with each other immediately after the completely-closable shutters 340 and 450 are opened. Therefore, the atmospheric pressure relation (1) is not immediately satisfied after these shutters are closed. In this substrate processing system 1, therefore, atmospheric pressure control is performed through timing control of retarding opening of the shutters until the atmospheric pressures of the transfer chamber 20, the buffer chamber 30 and the cleaning/drying chamber 40 obtained from output signals from the pressure sensors provided therein reach predetermined values satisfying the atmospheric pressure relation (1).

Due to such control of the internal atmospheric pressures in the respective chambers, the atmosphere necessarily flows from the transfer chamber 20 into the buffer chamber 30 when each substrate W is passed from the buffer chamber 30 to the transfer chamber 20, while the atmosphere necessarily flows from the buffer chamber 30 into the cleaning/drying chamber 40 when the substrate W is passed from any cleaning/drying chamber 40 to the buffer chamber 30 adjacent thereto. The flow of the atmospheres is that from chambers of dry atmospheres to those of slightly wet atmospheres, and such flow of the atmospheres is allowable with no problem.

Figure 6:
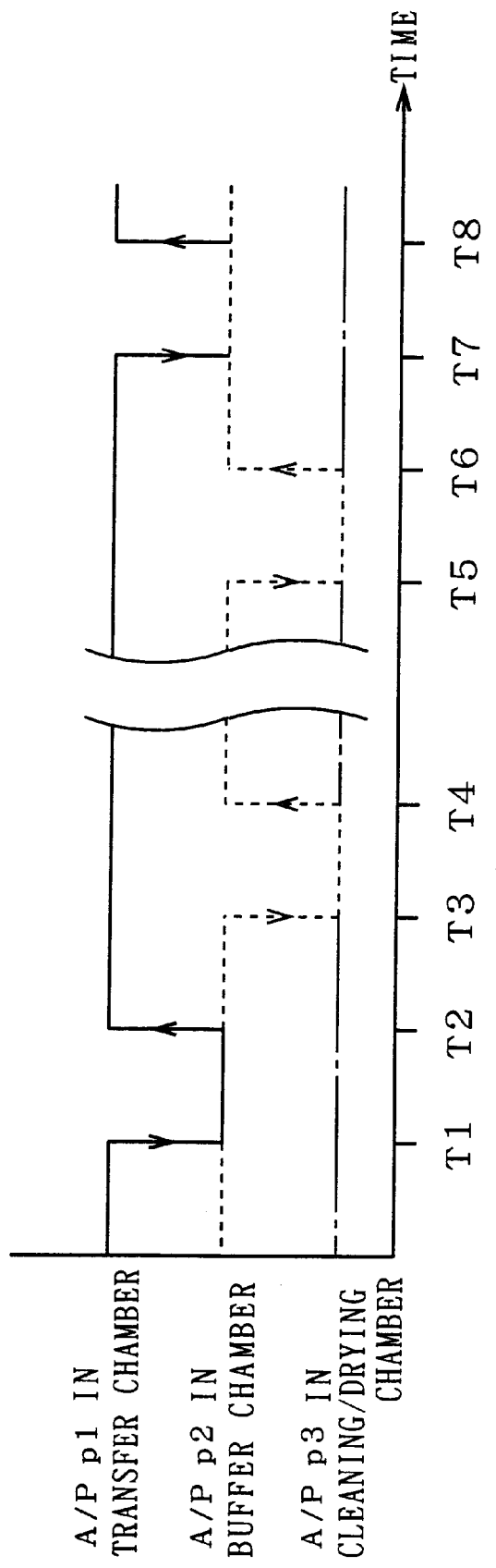
FIG. 6 illustrates time changes of atmospheric pressures in the respective chambers according to the first embodiment of the present invention.

FIG. 6 illustrates time changes of the atmospheric pressures in the respective chambers 20, 30 and 40 according to the first embodiment. With reference to FIG. 6, the time changes of the atmospheric pressures in the chambers 20, 30 and 40 are first described in relation to passage of each substrate W between the transfer chamber 20 and the cleaning/drying chamber 40 through the buffer chamber 30. Referring to FIG. 6, those shown on the axis of ordinates are not absolute levels of the atmospheric pressures, but relative levels of the atmospheric pressures in the respective chambers 20, 30 and 40. Further, those shown by straight lines provided with upwardly directed arrows are not instantaneous rises of the atmospheric pressures, but situations of gradually increased atmospheric pressures are expressed in this way for convenience of illustration.

Before a time T1, the mechanical hand 220 of the transfer chamber 20 takes out each untreated substrate W which is set in the loader/unloader 10. Immediately before this time T1, the atmospheric pressures in the transfer chamber 20, the buffer chamber 30 and the cleaning/drying chamber 40 satisfy the atmospheric pressure relation (1).

Then, the completely-closable shutter 340 is opened at the time T1. In this stage, the atmosphere in the transfer chamber 20 flows into the buffer chamber 30, whereby the atmospheric pressure p1 is equalized with the atmospheric pressure p2.

Then, the substrate W is introduced from the transfer chamber 20 into the buffer chamber 30 between the time T1 and a time T2, and the completely-closable shutter 340 is closed at the time T2. The atmospheric pressure p1 is increased in this stage, to satisfy the atmospheric pressure relation (1) again immediately before a time T3.

Then, the completely-closable shutter 450 is opened at the time T3. In this stage, the atmosphere in the buffer chamber 30 flows into the cleaning/drying chamber 40, whereby the atmospheric pressure p2 is equalized with the atmospheric pressure p3.

Then, the substrate W is introduced from the buffer chamber 30 into the cleaning/drying chamber 40 between the time T3 and a time T4, and the completely-closable shutter 450 is closed at the time T4. The atmospheric pressure p2 is increased in this stage, to satisfy the atmospheric pressure relation (1) again immediately before a time T5. In parallel with this, the substrate W introduced into the cleaning/drying chamber 40 is cleaned and thereafter dried between the times T4 and T5.

Then, the completely-closable shutter 450 is opened at the time T5. In this stage, the atmospheric pressure p2 is equalized with the atmospheric pressure p3 similarly to the above.

Then, the substrate W is discharged from the cleaning/drying chamber 40 to the buffer chamber 30 between the time T5 and a time T6, and the completely-closable shutter 450 is closed at the time T6. The atmospheric pressure p2 is increased again in this stage, to satisfy the atmospheric pressure relation (1) again immediately before a time T7.

Then, the completely-closable shutter 340 is opened at the time T7. In this stage, the atmospheric pressure p1 is equalized with the atmospheric pressure p2 similarly to the above.

Between the time T7 and a time T8, the substrate W is discharged from the buffer chamber 30 to the transfer chamber 20. The atmospheric pressure p1 is increased again in this stage, to gradually satisfy the atmospheric pressure relation (1).

Though the aforementioned series of steps, the substrate W is transferred to any of the three film forming chambers 50 from the transfer chamber 20, subjected to film formation therein, and thereafter transferred to the loader/unloader 10 again by the mechanical hand 220, to be stored in either cassette CA. Thus, all steps of this system are completed.

In the substrate processing system 1 according to the first embodiment, as hereinabove described, the buffer chamber 30 provided between the transfer chamber 20 and the cleaning/drying chamber 40 blocks atmospheric exchange between the transfer chamber 20 and the cleaning/drying chamber 40 while the completely-closable shutter 450 blocks atmospheric exchange between the cleaning/drying chamber 40 and the buffer chamber 30 and the completely-closable shutter 340 completely blocks atmospheric exchange between the buffer chamber 30 and the transfer chamber 20, whereby the slightly wet atmosphere in the cleaning/drying chamber 40 hardly influences the dry atmosphere in the transfer chamber 20 while the cleaning/drying chamber 40 can be connected with the transfer chamber 20 of the dry atmosphere through the buffer chamber 30, and hence the overall substrate processing system 1 is compacted.

Further, the atmospheric pressure relation (1) is satisfied at least immediately before the completely-closable shutters 340 and 450 are opened. Thus, it is possible to inhibit the atmosphere in the buffer chamber 30 from flowing into the transfer chamber 20 at the moment of opening the completely-closable shutter 340, while it is possible to inhibit the slightly wet atmosphere in the cleaning/drying chamber 40 from flowing into the buffer chamber 30 at the moment of opening the completely-closable shutter 450.

Further, units prepared by integrating the cleaning/drying chambers 40, the buffer chambers 30 and the completely-closable shutters 450 and 340 are formed as integral substrate processing units WU, whereby the substrate processing system 1 according to the first embodiment can be readily structured by combining the substrate processing units WU with a unit prepared by integrating the loader/unloader 10, the transfer chambers 20 and the film forming chambers 50 with each other.

<2. Second Embodiment>

A substrate processing system according to a second embodiment of the present invention is now described. The substrate processing system according to the second embodiment is absolutely identical in mechanical structure to the substrate processing system 1 according to the first embodiment. However, atmospheric pressure control in each transfer chamber 20, each buffer chamber 30 and each cleaning/drying chamber 40 in the second embodiment is different from that in the first embodiment. While the system according to the first embodiment performs atmospheric pressure control to satisfy the atmospheric pressure relation (1), the system according to the second embodiment is adapted to satisfy:

$$p2 > p1 > p3 \ldots \text{atmospheric pressure relation} \quad (2)$$

where $p1$ is the atmospheric pressure in the transfer chamber 20, $p2$ is the atmospheric pressure in the buffer chamber 30, and $p3$ is the atmospheric pressure in the cleaning/drying chamber 40, as in the atmospheric pressure relation (1).

Figure 7:
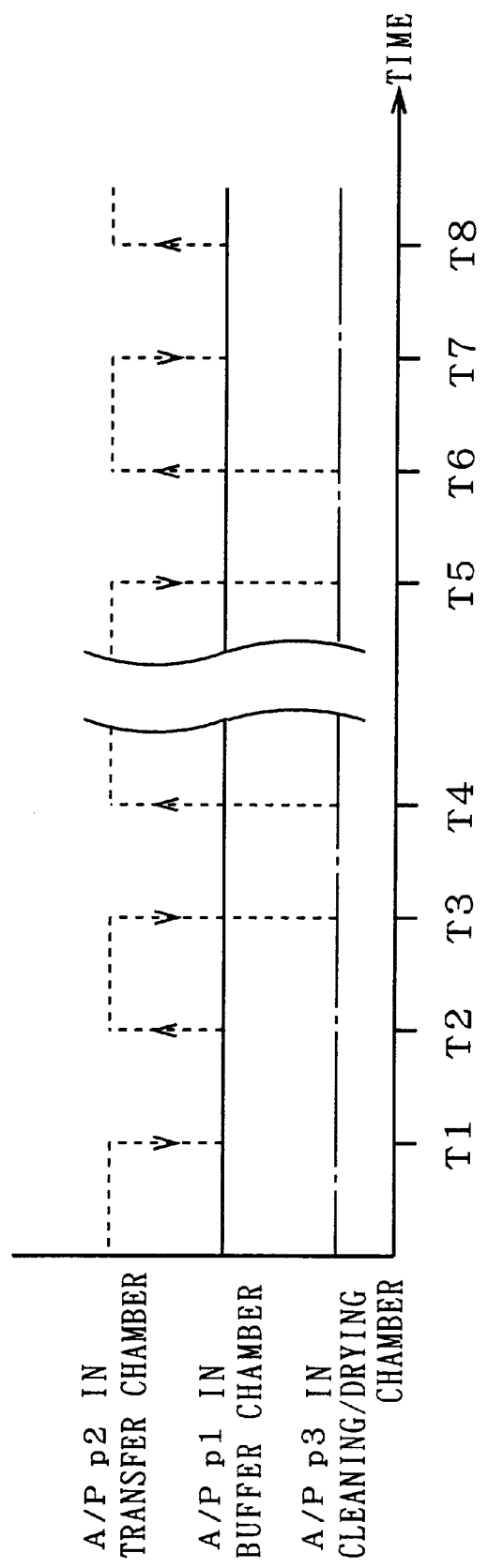
FIG. 7 illustrates time changes of atmospheric pressures in respective chambers according to a second embodiment of the present invention.
Figure 8:
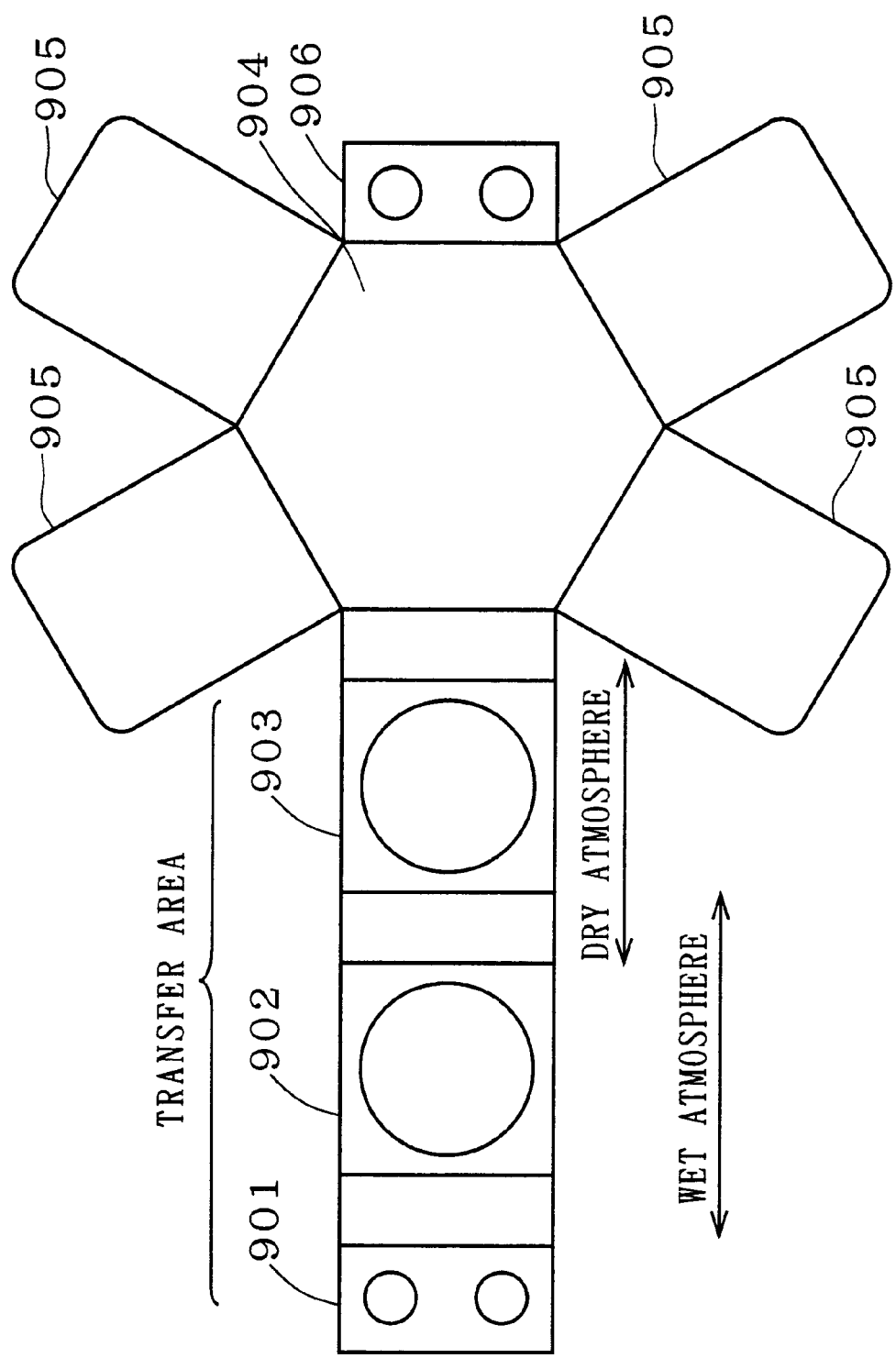
FIG. 8 is an overall block diagram showing a device to be compared with the present invention.

FIG. 7 illustrates time changes of the atmospheric pressures in the respective chambers 20, 30 and 40 according to the second embodiment. With reference to FIG. 7, the time changes of the atmospheric pressures in the chambers 20, 30 and 40 are described in relation to passage of each substrate W between the transfer chamber 20 and the cleaning/drying chamber 40 through the buffer chamber 30. Referring to FIG. 7, those shown on the axis of ordinates are not absolute levels of the atmospheric pressures, but relative levels of the atmospheric pressures in the respective chambers 20, 30 and 40. Further, those shown by straight lines provided with upwardly directed arrows are not instantaneous rises of the atmospheric pressures, but situations of gradually increased atmospheric pressures are expressed in this way for convenience of illustration.

Before a time T1, the mechanical hand 220 of the transfer chamber 20 takes out an untreated substrate W which is set in a loader/unloader 10. Immediately before the time T1, the atmospheric pressures in the transfer chamber 20, the buffer chamber 30 and the cleaning/drying chamber 40 satisfy the atmospheric pressure relation (2).

Then, the completely-closable shutter 340 is opened at the time T1. In this stage, the atmosphere in the buffer chamber 30 flows into the transfer chamber 20, whereby the atmospheric pressure p2 is equalized with the atmospheric pressure p1.

Then, the substrate W is introduced from the transfer chamber 20 into the buffer chamber 30 between the time T1 and a time T2, and the completely-closable shutter 340 is closed at the time T2. The atmospheric pressure p2 is increased in this stage, to satisfy the atmospheric pressure relation (2) again immediately before a time T3.

Then, a completely-closable shutter 450 is opened at the time T3. In this stage, the atmosphere in the buffer chamber 30 flows into the cleaning/drying chamber 40, whereby the atmospheric pressure p2 is equalized with the atmospheric pressure p3.

Then, the substrate W is introduced from the buffer chamber 30 into the cleaning/drying chamber 40 between the time T3 and a time T4, and the completely-closable shutter 450 is closed at the time T4. The atmospheric pressure p2 is increased in this stage, to satisfy the atmospheric pressure relation (2) again immediately before a time T5. In parallel with this, the substrate W introduced into the cleaning/drying chamber 40 is cleaned and thereafter dried between the times T4 and T5.

Then, the completely-closable shutter 450 is opened at the time T5. In this stage, the atmospheric pressure p2 is equalized with the atmospheric pressure p3 similarly to the above.

Then, the substrate W is discharged from the cleaning/drying chamber 40 to the buffer chamber 30 between the time T5 and a time T6, and the completely-closable shutter 450 is closed at the time T6. The atmospheric pressure p2 is increased again in this stage, to satisfy the atmospheric pressure relation (2) again immediately before a time T7.

Then, the completely-closable shutter 340 is opened at the time T7. In this stage, the atmospheric pressure p2 is equalized with the atmospheric pressure p1 similarly to the above.

Between the time T7 and a time T8, the substrate W is discharged from the buffer chamber 30 to the transfer chamber 20. The atmospheric pressure p2 is increased again in this stage, to gradually satisfy the atmospheric pressure relation (2).

Though the aforementioned series of steps, the substrate W is transferred to any of three film forming chambers 50 from the transfer chamber 20, subjected to film formation therein, and thereafter transferred to the loader/unloader 10 again by the mechanical hand 220, to be stored in either cassette CA. Thus, all steps of this system are completed.

Also in the substrate processing system according to the second embodiment, as hereinabove described, the atmospheric pressure relation (2) is satisfied at least immediately before the completely-closable shutters 340 and 450 are opened, whereby it is possible to inhibit the atmosphere in the buffer chamber 30 from flowing into the transfer chamber 20 at the moment of opening the completely-closable shutter 340 while it is possible to inhibit the slightly wet atmosphere in the cleaning/drying chamber 40 from flowing into the buffer chamber 30 at the moment of opening the completely-closable shutter 450.

Further, the other advantages of the substrate processing system according to the second embodiment are similar to those of the substrate processing system 1 according to the first embodiment.

<3. Modifications>

While atmospheric pressure control is performed to satisfy the atmospheric pressure relations (1) and (2) in the first and second embodiments respectively immediately before the completely-closable shutters 340 or 450 are opened, only atmospheric pressure inequality between the adjacent chambers may hold through the opened completely-closable shutter when either the completely-closable shutters 340 or 450 are opened while the remaining ones are closed. For example, the relation of atmospheric pressure p1>atmospheric pressure p2 may be satisfied with no control of the atmospheric pressure p3 immediately before only the completely-closable shutter 340 is opened and the relation of atmospheric pressure p2>atmospheric pressure p3 may be satisfied with no control of the atmospheric pressure p1 immediately before only the completely-closable shutter 450 is opened in the system according to the first embodiment. Similarly, the relation of atmospheric pressure p2>atmospheric pressure p1 may be satisfied with no control of the atmospheric pressure p3 immediately before only the completely-closable shutter 340 is opened and the relation of atmospheric pressure p2>atmospheric pressure p3 may be satisfied with no control of the atmospheric pressure p1 immediately before only the completely-closable shutter 450 is opened in the system according to the second embodiment, for example.

While the substrate processing system 1 is adapted to perform film formation in each of the first and second embodiments, the present invention is not restricted to this but may be directed to oxidation or nitriding.

While the cleaning/drying chamber 40 performs cleaning in a wet atmosphere and drying in a dry atmosphere in each of the first and second embodiments, a plurality of processings in wet atmospheres may be performed in the chamber 40 without wet processings.

While the completely-closable shutter 450 is provided between the buffer chamber 30 and the cleaning/drying chamber 40 in each of the first and second embodiments, this shutter 40 may be replaced with an incompletely-closable shutter.

While the amounts of supplied gas and the diameters of the outlet ports are adjusted for forming the inequality relation between the atmospheric pressures in the respective chambers in each of the first and second embodiments, the casings of the respective chambers may be rendered unclosable with no outlet ports so that the inequality is regulated by only the amounts of supplied gas, or the outlet ports may be provided with control valves whose opening degrees are controlled.

While the invention has been shown and described in detail, the foregoing description is in all aspects illustrative and not restrictive. It is therefore understood that numerous modifications and variations can be devised without departing from the scope of the invention.

We claim:

1. A substrate processing system comprising:
   a) a transfer part for transferring a substrate;
   b) a first processing part being provided around said transfer part for treating said substrate in a dry atmosphere;
   c) a second processing part being provided around said transfer part for cleaning said substrate in a wet atmosphere, said second processing part comprising;
   c-1) a holding member for holding said substrate;
   c-2) a base member for having said holding member on a peripheral edge portion thereof;
   c-3) a rotation driving part for rotating said base member; and
   c-4) a nozzle for supplying cleaning liquid to said substrate; and
   d) a buffer part being provided between said transfer part and said second processing part.

2. The substrate processing system in accordance with claim 1, wherein said buffer part comprises:
   e) first cutoff means for cutting off an atmosphere between said second processing part and said buffer part, and
   f) second cutoff means for cutting off an atmosphere between said buffer part and said transfer part.

3. The substrate processing system in accordance with claim 2, wherein
   said first cutoff means and/or said second cutoff means comprises a completely-closable shutter being capable of completely cutting off said atmosphere.

4. The substrate processing system in accordance with claim 1, further comprising:
   g) control means for controlling an internal atmosphere of at least one of said second processing part and said buffer part.

5. The substrate processing system in accordance with claim 4, wherein said control means comprises:
   g-1) pressure detection means for detecting pressures in said second processing part and said buffer part, and
   g-2) pressure control means for controlling said pressures in said second processing part and said buffer part on the basis of detection results of said pressure detection means.

6. The substrate processing system in accordance with claim 5, wherein said pressure control means comprises:
   g-2-1) a first outlet port having a first diameter for discharging atmosphere from said second processing part; and
   g-2-2) a second outlet port having a second diameter for discharging atmosphere from said buffer part,
   wherein said first diameter is larger than said second diameter.

7. The substrate processing system in accordance with claim 5, wherein said control means further comprises:
   g-3) timing control means for opening said first cutoff means after a pressure in said buffer part exceeds a pressure in said second processing means.

8. The substrate processing system in accordance with claim 7, wherein
   said pressure detection means is operable to further detect a pressure in said transfer part, and
   said pressure control means is operable to further control said pressure in said transfer part.

9. The substrate processing system in accordance with claim 8, wherein said transfer part comprises:
   a-1) a plurality of hold means each operable to hold said substrate and transferring said substrate between said transfer part and either of said first processing part and said buffer part.

10. The substrate processing system in accordance with claim 9, wherein said buffer part further comprises:
    d-1) means for delivering said substrate between said transfer part and said second processing part.

11. The substrate processing system in accordance with claim 10, wherein
    said first processing part is operable to form a film on said substrate, and
    said second processing part is operable to apply a wet-cleaning process and a drying process to said substrate.

12. The substrate processing system in accordance with claim 11, wherein said second processing part comprises:
    a cover member for blocking said wet atmosphere around said substrate,
    said second processing part performing said wet-cleaning process and said drying process while blocking said wet atmosphere by said cover member.

* * * * *